United States Patent [19]
Huang et al.

[11] Patent Number: 5,661,742
[45] Date of Patent: Aug. 26, 1997

[54] LIGHT EMITTING DIODE STRUCTURE

[76] Inventors: Kuo-Hsin Huang, 10-1Fl., No. 36, Sec. 1, Kwang Fu Road; Tzer-Perng Chen, 3Fl., No. 55, Alley 10, Lane 81, Kwang Hua Street 2, both of Hsinchu City, Taiwan

[21] Appl. No.: 652,328

[22] Filed: May 22, 1996

Related U.S. Application Data

[63] Continuation-in-part of Ser. No. 500,042, Jul. 10, 1995, abandoned.

[51] Int. Cl.$^6$ ................................................ H01S 3/19
[52] U.S. Cl. ............................... 372/46; 257/94; 257/97; 372/45
[58] Field of Search ........................... 372/45, 46; 257/94, 257/97

[56] References Cited

U.S. PATENT DOCUMENTS

| | | | |
|---|---|---|---|
| 5,008,718 | 4/1991 | Fletcher et al. | 372/45 |
| 5,153,889 | 10/1992 | Sugawara et al. | 372/45 |
| 5,359,209 | 10/1994 | Huang | 257/94 |
| 5,410,159 | 4/1995 | Sugawara et al. | 257/97 |

*Primary Examiner*—James W. Davie

[57] ABSTRACT

A light emitting diode comprises a multiple quantum well structure. The light emitting diode has a first conductivity type GaAs substrate, an AlGaInP lower cladding layer of the first conductivity type, a multiple quantum well structure, an AlGaInP upper cladding layer of a second conductivity type, and a window structure of the second conductivity type. The multiple quantum well structure comprises a plurality of AlGaInP quantum well layers and barrier layers being stacked alternatively on each other. The window structure including a thin layer having low energy band gap and high conductivity GaAs or GaInP, and a thicker layer having high energy band gap and transparent GaP containing a small amount of In. The use of multiple quantum well structure improves the light intensity and the Iv-I curve linearity of the light emitting diode. The small amount of In in the window layer reduces the defect density generated in the GaP layer due to the lattice mismatch between the window layer and the upper cladding layer. Another improvement that includes growing a distributed Bragg reflector layer between the lower cladding layer and substrate is also presented to further increase the luminous efficiency of the light emitting diode.

16 Claims, 9 Drawing Sheets

LIGHT EMITTING DIODE STRUCTURE

This is a continuation-in-part of application Ser. No. 08/500,042, filed Jul. 10, 1995, now abandoned.

FIELD OF THE INVENTION

This invention relates to the structure of a semiconductor light emitting diode, and more specifically to a light emitting diode structure comprising multiple quantum wells or strained multiple quantum wells.

BACKGROUND OF THE INVENTION

In recent years, light emitting diodes are widely adopted in many applications. The improvement of the luminous intensity for light emitting diodes has been greatly researched. There are many new developments in the structure of light emitting diodes that provide better quality and higher light intensity. Among the newest light emitting diodes, many of them are based on a double heterostructure comprising an upper cladding layer, a lower cladding layer, and an active layer between them. In general, the light emitting efficiency is quite limited because of the high resistivity in the upper cladding layer that makes the spread of the electric current difficult.

Several techniques and structures have been developed to improve the luminous efficiency for the light emitting diodes. Most of the approaches that have been developed focus on forming high conductivity window layer or layers on top of the double heterostructure for the purpose of increasing current spreading. U.S. Pat. No. 5,008,718 presents a high energy band gap and transparent window layer to improve the luminous intensity of a light emitting diode. U.S. Pat. No. 5,359,209 describes a double layer window structure including a low energy band gap layer and a high energy band gap layer.

Although the luminous efficiency of a light emitting diode has shown significant improvement in recent years, higher light intensity is still strongly demanded in many applications. In addition, better and more reliable structure of light emitting diode with less structural defects and longer life time is also very important.

SUMMARY OF THE INVENTION

In order to meet the demand of higher luminous intensity and better quality light emitting diodes, the present invention presents a new structure for light emitting diodes. The improved light emitting diode structures mentioned in U.S. Pat. Nos. 5,153,889 and 5,008,718 requires two MOVPE processes or one MOVPE process along with VPE process to manufacture. In the present invention, only one MOVPE process is necessary. Therefore, the manufacturing cost is reduced and the yield rate increased According to the present invention, the active layer of the double heterostructure is replaced by a multiple quantum well structure or a strained multiple quantum well structure. The new structure provides a higher luminous intensity and relative luminous intensity versus forward current curve linearity. The emitted light using the structure also has narrower full width half maximum (FWHM) bandwidth. The invention further includes a distributed Bragg reflector between the substrate and the double heterostructure. The light intensity is enhanced by the reflector layer. In the window structure, the invention uses two layer window structure similar to the window structure described in U.S. Pat. No. 5,359,209. By adding a small amount of In in the high energy band gap window layer, the defect density in the GaP window layer is decreased due to impurity hardening effect.

The principle of this invention and other advantages can further be understood from the following detailed description and accompanying drawings.

DETAILED DESCRIPTION OF THE PREFERRED EMBODIMENTS

Figure 1:
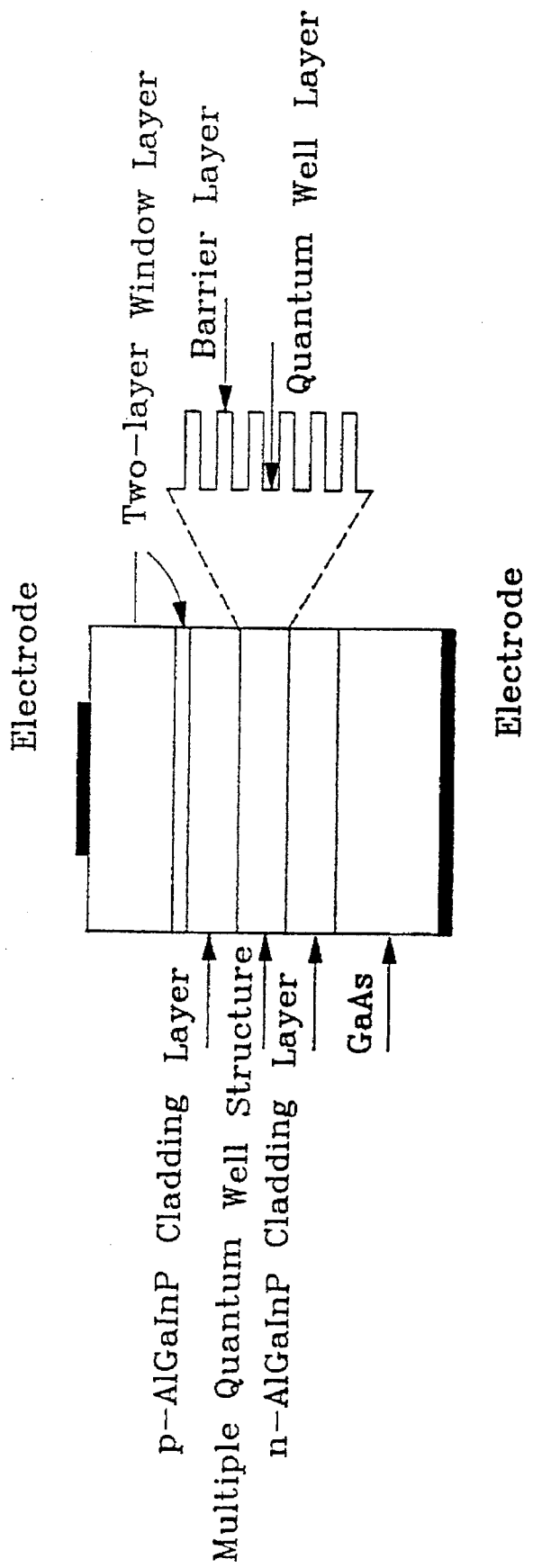
FIG. 1 shows a sectional view for the structure of the light emitting diode of the present invention.

With reference to FIG. 1, the structure of the light emitting diode of this invention includes a GaAs substrate of a first conductivity type. A first conductivity type AlGaInP lower cladding layer is grown on the substrate. Above the substrate is a multiple quantum well structure comprising a plurality of quantum well layers and barrier layers. The quantum well layer of the present invention is made of $(Al_xGa_{1-x})InP$. The content of Al in the quantum layer has an x value between 0 and 0.5. In the barrier layer, the value of x is between 0.3 to 1 dependent on the desired wavelength of the emitted light. The thickness of the quantum well layer or barrier layer is between 10 Angstroms to 500 Angstroms.

The quantum well layers or beer layers are usually grown in an MOVPE system. The uniformity in thickness of a crystal layer or between two layers becomes more difficult to control as the desired thickness gets smaller. In the present invention, the preferred thickness of the quantum well layer is above 8 nm. But it should also be noted that the quantum size effect will be lost if the quantum well layer is too thick. The preferred thickness of the barrier layer is greater than 20 nm for achieving better reliability.

On top of the quantum well structure is an upper cladding layer of a second conductivity type AlGaInP. A window structure is then formed above the upper cladding layer. As shown in FIG. 1, the window structure of this invention includes two layers of the second conductivity type material. The first layer is a thin layer of low energy band gap and high conductivity material. The second layer is a thicker layer of high energy band gap and transparent material. The material of the first thin layer can be GaAs or GaInP. The material of the second layer is GaP containing a small quantity of In. In the present invention, the ratio of In to the GaP material in the second layer is in the range of 0.1% ~1%. Because of the existence of In in GaP material, it has impurity hardening effect. Therefore, the defect density in the GaP window layer is reduced.

The light emitting diode of the present invention has increased its light intensity significantly. In particular, the quantum efficiency is almost tripled when the diode current is small. The light intensity of the light emitting diode is approximately 1.5 to 2 times that of a conventional light emitting diode when the diode is operated with 20 mA current. Because of the improvement in the quantum efficiency, the light intensity and the diode current also have better linear relationship.

Figure 2:
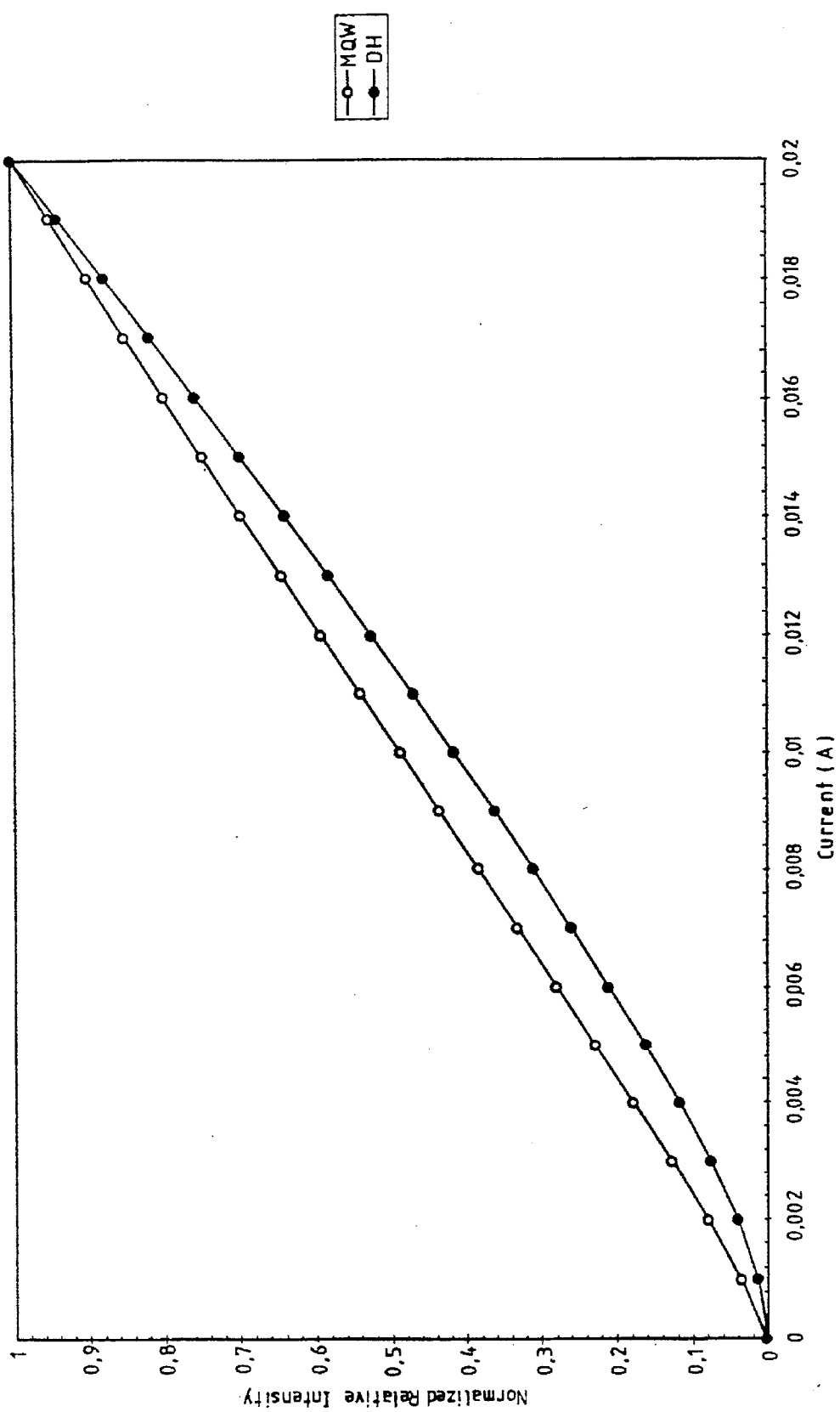
FIG. 2 shows the relationship between the luminous intensity and the diode current for both the present invention and a conventional double heterostructure light emitting diode.
Figure 3:
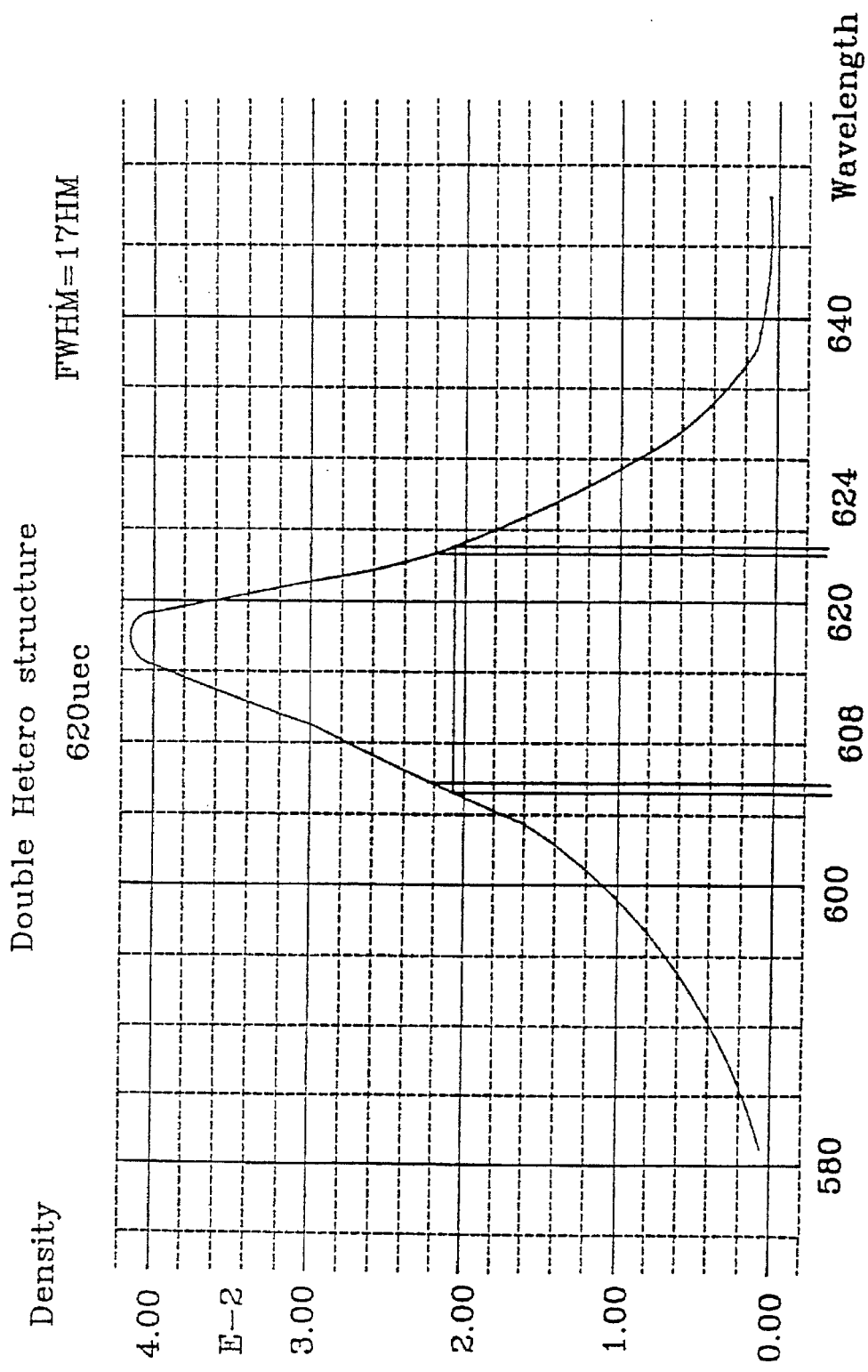
FIG. 3 shows the emitted light intensity as a function of the wavelength for a conventional light emitting diode having a central frequency at around 620 nm wavelength.
Figure 4:
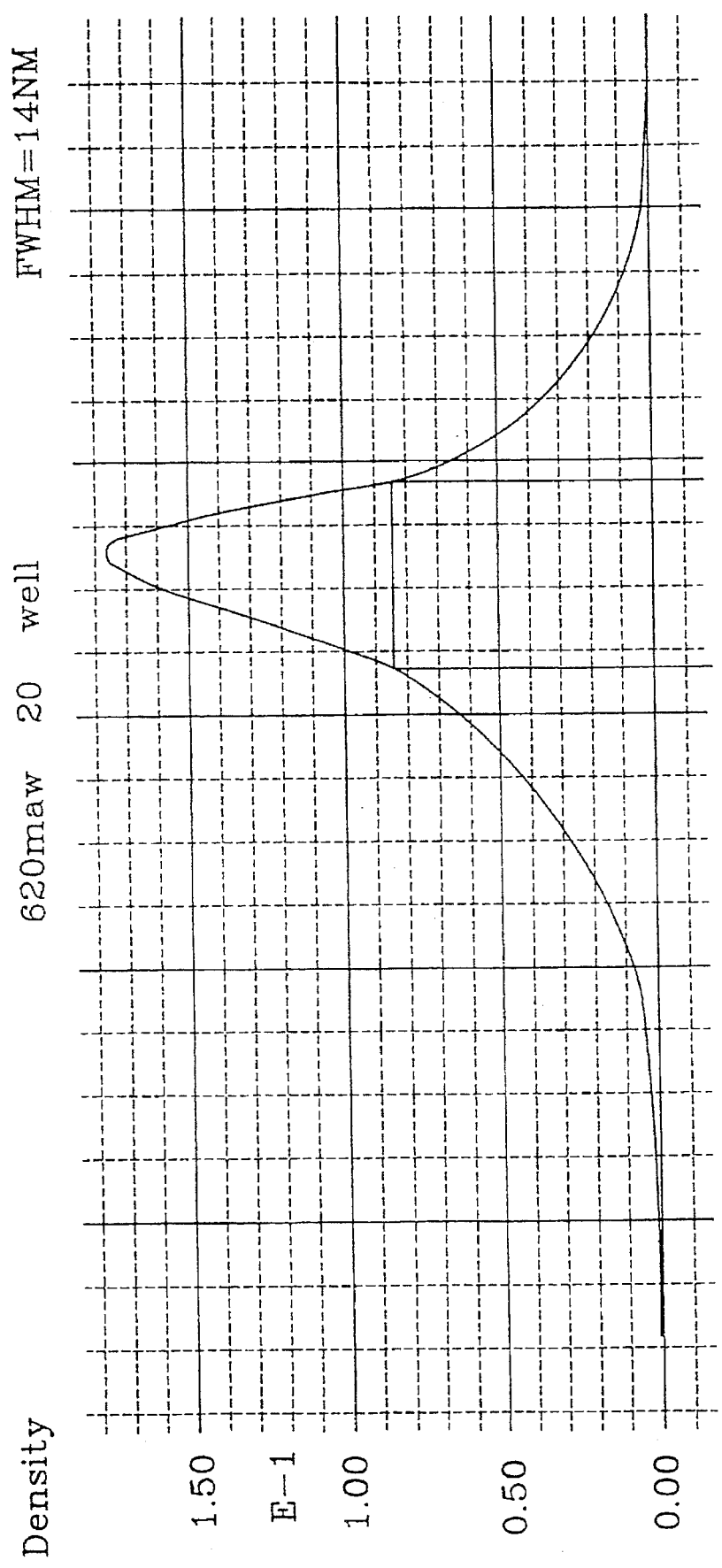
FIG. 4 shows the emitted light intensity as a function of the wavelength for the light emitting diode of the present invention having a central frequency at around 620 nm wavelength.

FIG. 2 shows the light intensity as a function of the current for both the light emitting diode of this invention with multi-quantum well active layer and a conventional double heterostructure light emitting diode. It can be easily seen that the luminous intensity for the present invention is greatly improved at low injection current. Another important characteristics of this invention is that the light emitting diode has narrower bandwidth. FIG. 3 shows the light intensity with respect to the wavelength for a conventional light emitting diode for which the emitted light has a central frequency at around 620 nm wavelength. The bandwidth of the diode is approximately 17 nm. The light intensity as a function of the wavelength for the light emitting diode comprising the multiple quantum well structure of this invention is shown in FIG. 4. The bandwidth of this invention is about 14 nm. For diodes having 595 nm wavelength, the bandwidth of a conventional diode is roughly 15 nm and the bandwidth of the diode in the present invention is about 13 nm.

Figure 5:
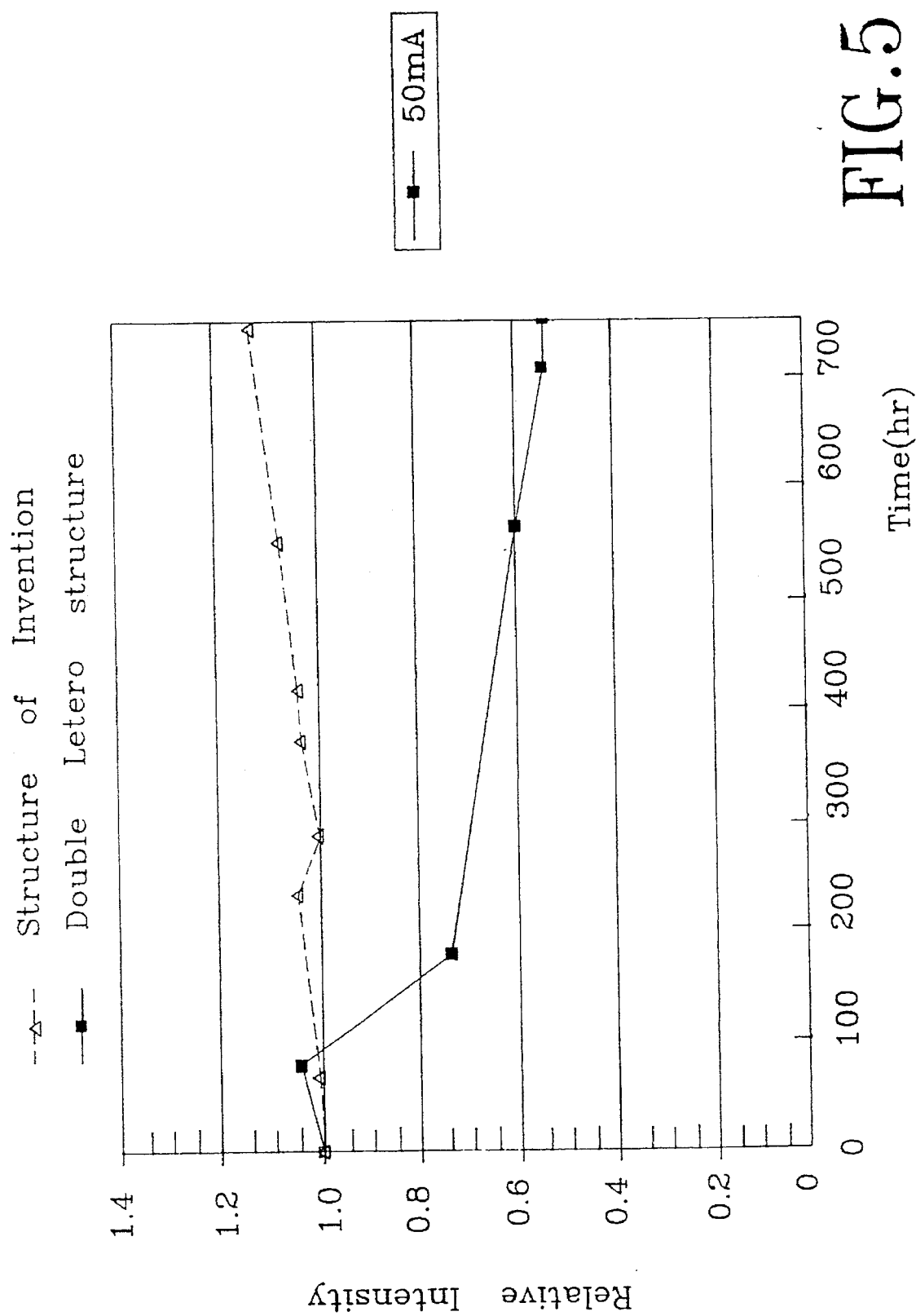
FIG. 5 shows light intensities as functions of elapsed time for the light emitting diode of the present invention and a conventional double heterostructure light emitting diode.

Another advantage of the present invention is that the light emitting diode has a longer life. Because of the lower aluminum content and the higher radiative recombination efficiency of the quantum well or strained quantum well structure, the light emitting diode in this invention has a slower decay rate. FIG. 5 compares the light intensity variation after a long period of time for the conventional diode and the present invention operating at 50 mA, RT. It can be seen that the present invention has significantly higher relative light intensity after it has been operated for more than about 700 hours.

Figure 6A:
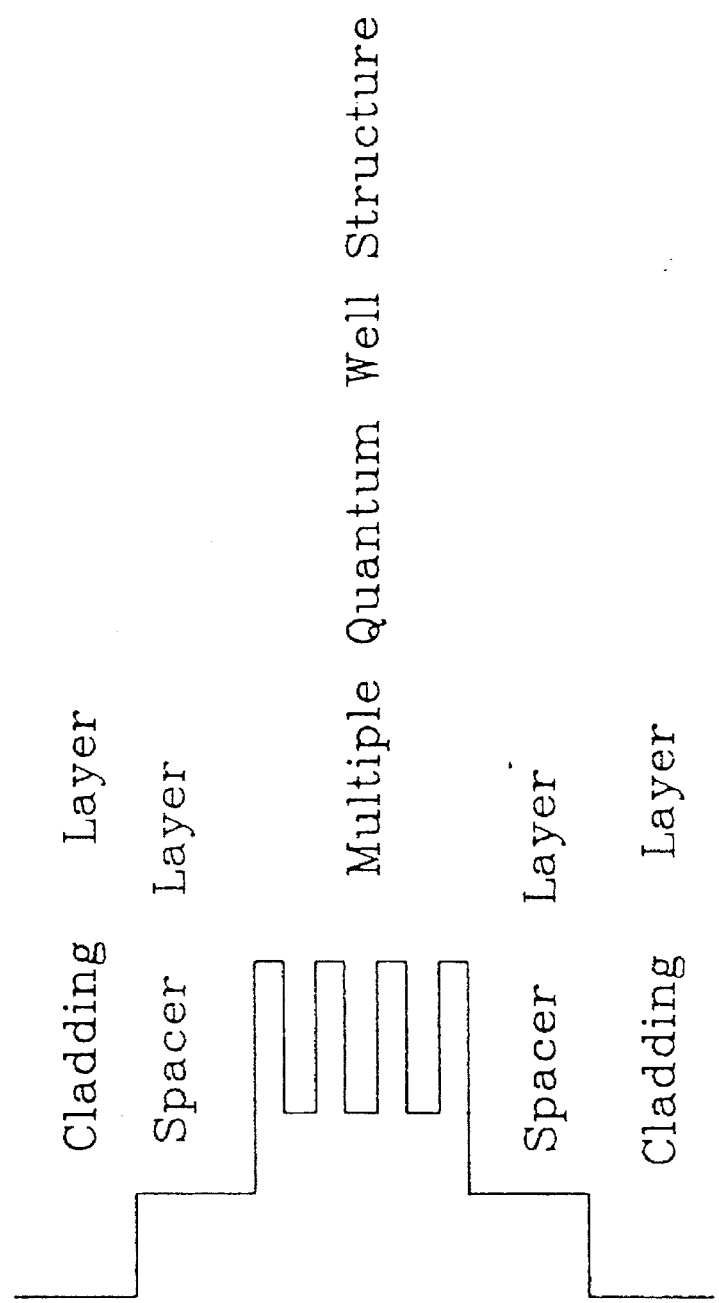
FIG. 6(a) shows the design of the multiple quantum well structure of the present invention having spacer layers of a fixed composition.
Figure 6B:
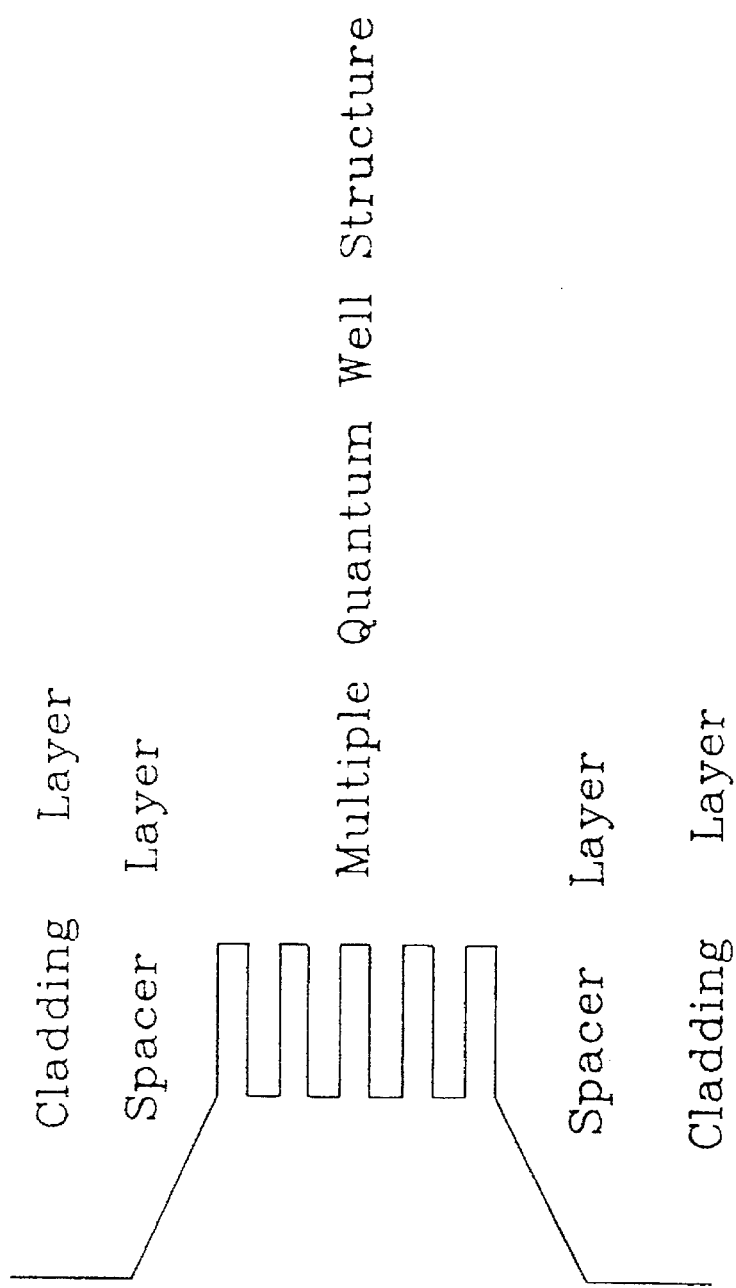
FIG. 6(b) shows another design of the multiple quantum well structure of the present invention having spacer layers of a linearly varied composition.
Figure 6C:
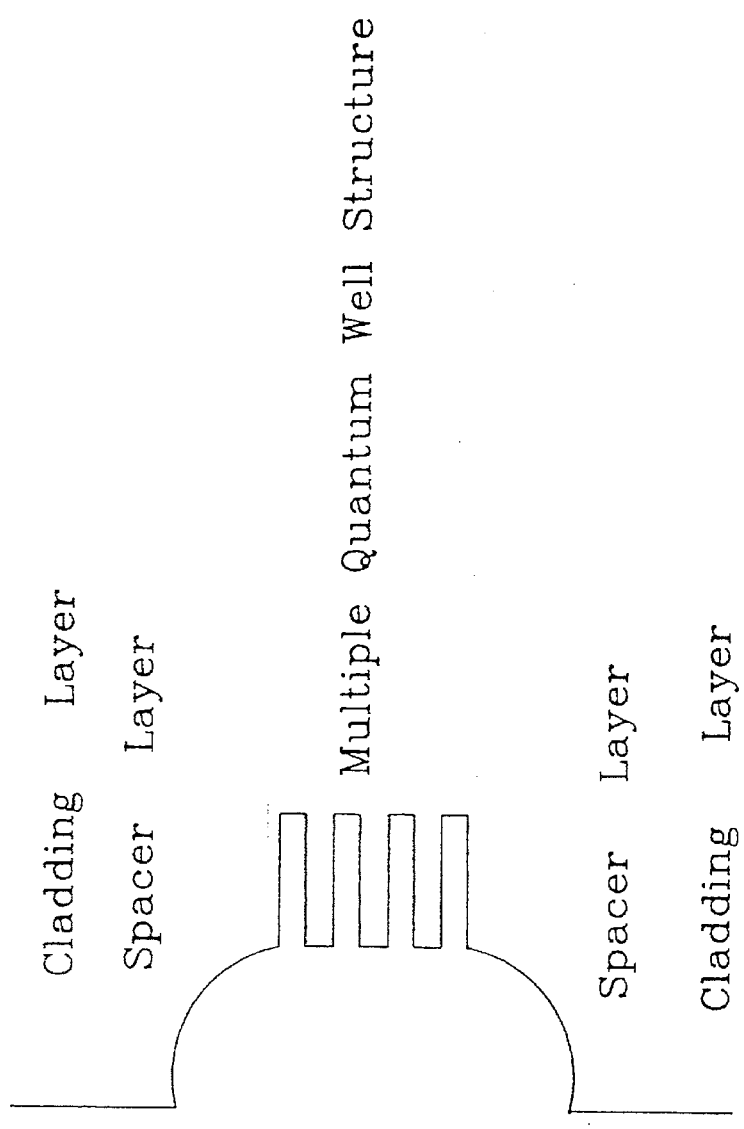
FIG. 6(c) shows another design of the multiple quantum well structure of the present invention having spacer layers of a parabolicly varied composition.

The design of the quantum well structure in the present invention has several different variations. The different designs can all achieve similar effects. FIGS. 6(a), 6(b) and 6(c) depict several design examples. In the design of FIG. 6(a), the spacer layers between the quantum well structure and the cladding layers have a fixed composition. The spacer layers of the design in FIG. 6(b) have a linearly varied composition. In FIG. 6(c), the spacer layers has a composition that varied parabolicly.

In the multiple quantum well structure described above, the active layer can also be strained multiple quantum well structure. A pre-determined strain can be designed in the quantum well. The strain is either compressive strain or tensile strain. The strain can exist only in the quantum well layer or the barrier layer in order to achieve the same effect. In a strained quantum well, if the strain is large and the number of quantum wells is beyond a certain limit, the thickness may exceed the critical layer thickness at which the elastic strain energy is larger than the misfit dislocation energy. Consequently, the misfit dislocation density at the interface increases sharply, relieving the elastic strain. This results in the light intensity degradation and other reliability problems. Using a thicker barrier layer (20–40 nm) can reduce the interaction of two adjacent strain wells. Therefore, the number of quantum wells can be increased without degrading the quality of the light emitting diode. Besides, strain can be added on both quantum well layers and barrier layers. For example, the quantum well layer has compressive strain and the barrier layer has tensile strain or vice versa. If the strain and thickness in each well and barrier layers are well controlled and the net strain in the whole multiple-strained quantum well is close to zero, the number of quantum wells can be as large as forty to fifty without degrading the quality of the light emitting diode.

Figure 7:
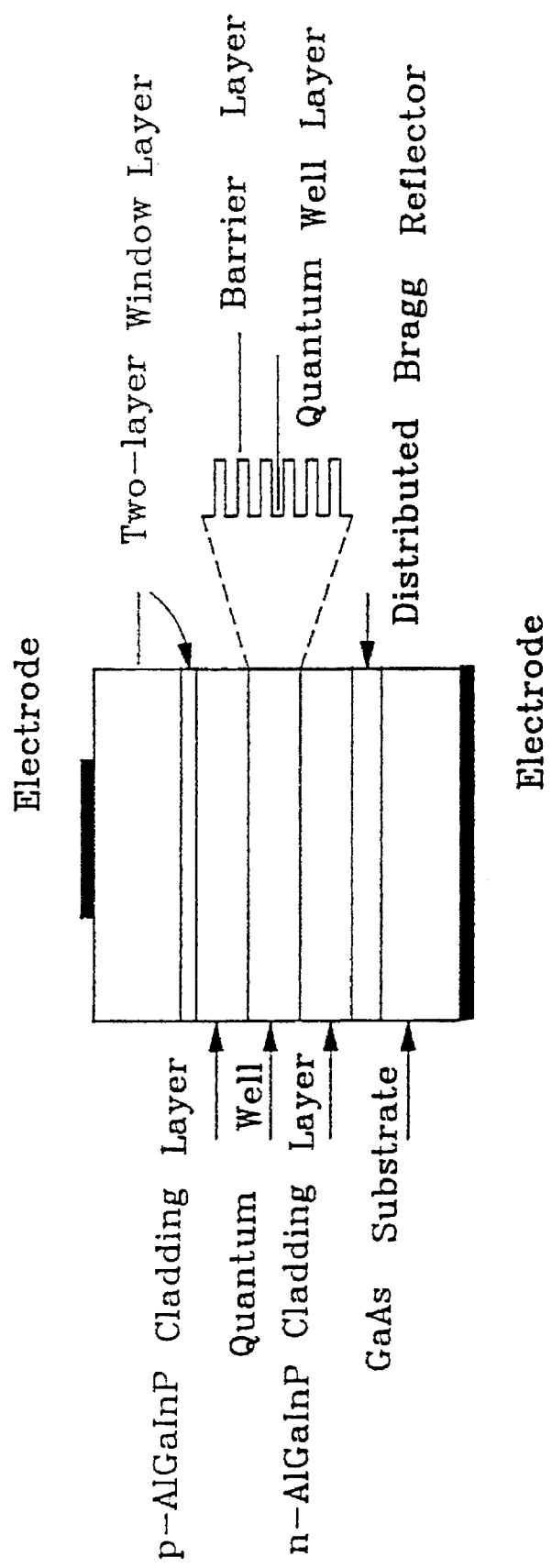
FIG. 7 shows a sectional view for another structure of the light emitting diode of the present invention having a distributed Bragg reflector layer.

The present invention further presents another improvement in the structure of the light emitting diode. As illustrated in FIG. 7, a distributed Bragg reflector layer of the first conductivity is first grown on the GaAs substrate before the cladding layers, the quantum well structure, and the window layers as shown in FIG. 1 are grown on the substrate. Because of the insertion of a distributed Bragg reflector layer, part of the light which would otherwise be absorbed by the GaAs substrate can be reflected. Therefore, the light intensity of the diode is improved by another factor of 1.5 to 2 when compared to the diode described earlier. Therefore, the overall improvement of the luminous efficiency in this invention can achieve a factor as high as 2.25 to 4.

In summary, the structure of the present invention uses multiple quantum well structure or strained multiple quantum well structure to increase the light intensity significantly. The light intensity versus diode current has a better linear relationship. The bandwidth of the light emitting diode is also narrower. Because of the addition of In in the GaP window layer, the defect density in the GaP window layer is reduced, hence, the life of the light emitting diode is increased.

The improved light emitting diode structures mentioned in U.S. Pat. Nos. 5,153,889 and 5,008,718 generally requires two MOVPE processes or one MOVPE process along with VPE or LPE process to manufacture. Advanced wafer fusing or wafer bonding technology is also used to manufacture the improved light emitting diode as mentioned in U.S. Pat. No. 5,376,580. In contrast, the manufacturing of the light emitting diode of this invention requires only one MOVPE process. Therefore, this invention also presents a light emitting diode structure that is relatively easy and low cost to manufacture.

What is claimed is:

1. A light emitting diode comprising:
    a semiconductor substrate GaAs of a first conductivity type, said substrate having a top side and a bottom side;
    a first electrode formed on said bottom side of said substrate;
    a lower cladding AlGaInP layer of said first conductivity type being grown on said top side of said substrate;
    a multiple quantum well structure being formed on said lower cladding layer, said quantum well structure comprising a plurality of $(Al_xGa_{1-x})InP$ quantum well layers and a plurality of $(Al_xGa_{1-x})InP$ barrier layers;
    an upper cladding AlGaInP layer of a second conductivity type being formed on said quantum well structure;
    a window structure of said second conductivity type being formed on said upper cladding layer, said window structure comprising a first thin layer of low energy band gap and high conductivity material and a second thick layer of transparent and high energy band gap GaP containing about 0.1% to 1% of In; and a second electrode formed on a part of said second window layer.

2. The light emitting diode according to claim 1, wherein said quantum well structure further has a top spacer layer and a bottom spacer layer, said spacer layers having a fixed composition.

3. The light emitting diode according to claim 1, wherein said quantum well structure further has a top spacer layer and a bottom spacer layer, said spacer layers having a linearly varied composition.

4. The light emitting diode according to claim 1, wherein said quantum well structure further has a top spacer layer and a bottom spacer layer, said spacer layers having a parabolicly varied composition.

5. The light emitting diode according to claim 1, wherein said quantum well structure is a strained multiple quantum well structure and said quantum layers have strain.

6. The light emitting diode according to claim 1, wherein said quantum well structure is a strained multiple quantum well structure and said barrier layers have strain.

7. The light emitting diode according to claim 1, wherein said quantum well structure is a strained multiple quantum well structure and both said quantum well layers and said barrier layers have strain.

8. The light emitting diode according to claim 1, wherein said first layer of said window structure comprising GaAs or GaInP.

9. A light emitting diode comprising:

a semiconductor substrate GaAs of a first conductivity type, said substrate having a top side and a bottom side;

a first electrode formed on said bottom side of said substrate;

a distributed Bragg reflector layer of said first conductivity type being formed on said top side of said substrate;

a lower cladding AlGaInP layer of said first conductivity type being grown on said reflector layer;

a multiple quantum well structure being formed on said lower cladding layer, said quantum well structure comprising a plurality of $(Al_xGa_{1-x})InP$ quantum well layers and a plurality of $(Al_xGa_{1-x})InP$ barrier layers;

an upper cladding AlGaInP layer of a second conductivity type being formed on said quantum well structure;

a window structure of said second conductivity type being formed on said upper cladding layer, said window structure comprising a first thin layer of low energy band gap and high conductivity material and a second thick layer of transparent and high energy band gap GaP containing about 0.1% to 1% of In; and a second electrode formed on a part of said second window layer.

10. The light emitting diode according to claim 9, wherein said quantum well structure further has a top spacer layer and a bottom spacer layer, said spacer layers having a fixed composition.

11. The light emitting diode according to claim 9, wherein said quantum well structure further has a top spacer layer and a bottom spacer layer, said spacer layers having a linearly varied composition.

12. The light emitting diode according to claim 9, wherein said quantum well structure further has a top spacer layer and a bottom spacer layer, said spacer layers having a parabolicly varied composition.

13. The light emitting diode according to claim 9, wherein said quantum well structure is a strained multiple quantum well structure and said quantum layers have strain.

14. The light emitting diode according to claim 9, wherein said quantum well structure is a strained multiple quantum well structure and said barrier layers have strain.

15. The light emitting diode according to claim 9, wherein said quantum well structure is a strained multiple quantum well structure and both said quantum well layers and said barrier layers have strain.

16. The light emitting diode according to claim 9, wherein said first layer of said window structure comprising GaAs or GaInP.

* * * * *